United States Patent [19]

Su

[11] Patent Number: 5,324,712
[45] Date of Patent: Jun. 28, 1994

[54] FORMATION OF THE HIGH TC 2223 PHASE IN BI-SR-CA-CU-O BY SEEDING

[75] Inventor: Sophia R. Su, Weston, Mass.

[73] Assignee: GTE Laboratories Incorporated, Waltham, Mass.

[21] Appl. No.: 745,819

[22] Filed: Aug. 16, 1991

[51] Int. Cl.$^5$ .................... H01B 12/00; H01B 1/06
[52] U.S. Cl. .................... 505/492; 505/782; 505/501; 252/521
[58] Field of Search ............ 505/782, 1; 252/521

[56] References Cited

U.S. PATENT DOCUMENTS 4,990,493  2/1991  Lay .................................. 505/1

FOREIGN PATENT DOCUMENTS

| | | | |
|---|---|---|---|
| 2-092827 | 4/1990 | Japan | 505/782 |
| 2-120228 | 5/1990 | Japan | 505/782 |
| 2-120234 | 5/1990 | Japan | 505/782 |
| 2-243519 | 9/1990 | Japan | 505/782 |
| 2-248321 | 10/1990 | Japan | 505/782 |
| 3-170335 | 7/1991 | Japan | 505/782 |

OTHER PUBLICATIONS

S. R. Su et al., "Novel Method of Synthesis for the 110 Phase of $(BiPb)_2Sr_2Ca_2Cu_3O_{10}$ Materials in the Form of Wires and Thick Films," Presented at NATO Advanced Study Institute—Physics and Materials Science of HTS (Abstract published in Proceedings—Physics and Materials of high $T_c$ Superconductors) Halkidiki, Greece (Aug. 18-31, 1991).

Primary Examiner—Michael Lewis
Assistant Examiner—Steven Bos
Attorney, Agent, or Firm—Frances P. Craig

[57] ABSTRACT

A process for producing a high critical temperature bismuth strontium calcium copper oxide superconducting material. An intimate mixture is formed of two superconducting materials. The first material is bismuth strontium calcium copper oxide or (bismuth, lead) strontium calcium copper oxide, and has a bulk critical temperature below about 90K. The second material is a seeding powder of bismuth strontium calcium copper oxide or (bismuth, lead) strontium calcium copper oxide, and includes at least 20 volume percent 2223 phase. The amount of seeding material added to the mixture is selected to result in an amount of 2223 phase in the mixture of about 2-50 weight percent. The mixture is annealed in an oxidizing atmosphere at a temperature of at least about 845° C. and below the melting temperature of the 2223 phase, for a time sufficient to increase the amount of 2223 phase in the mixture. In an alternate embodiment, one or both of the superconducting materials in the mixture are provided by drying, calcining, and annealing a precursor mixture of a $Sr(NO_3)_2$ solution, a $Ca(NO_3)_2$, solution, a $Cu(NO_3)_2$ solution, a $Bi_2O_3$ powder, and a PbO powder.

17 Claims, 3 Drawing Sheets

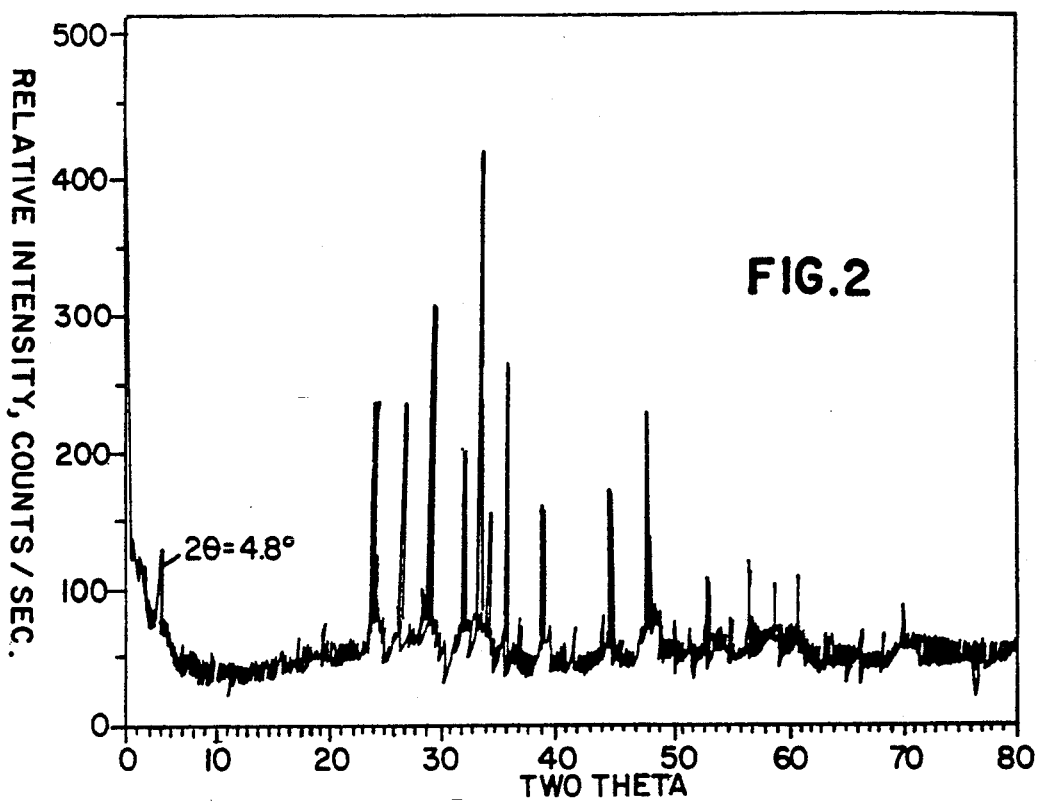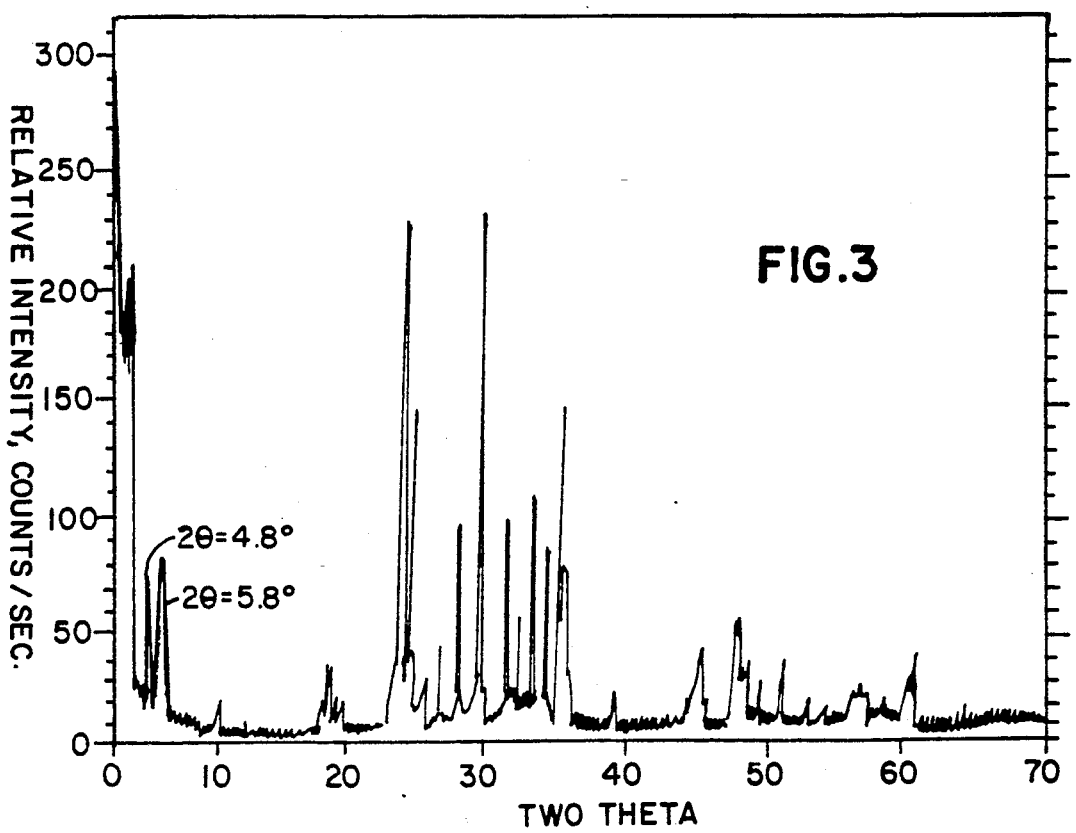

FORMATION OF THE HIGH TC 2223 PHASE IN BI-SR-CA-CU-O BY SEEDING

FIELD OF THE INVENTION

This invention relates to a process for producing high temperature ceramic superconductors, in particular bismuth strontium calcium copper oxide superconductors.

BACKGROUND OF THE INVENTION

The discovery of new high $T_c$ superconducting materials in the bismuth strontium calcium copper oxide (Bi-Sr-Ca-Cu-O) system represented a step forward in oxide superconducting materials. This system also includes formulations including lead (Bi-Pb-Sr-Ca-Cu-O). The bismuth strontium calcium copper oxide system contains three major phases with different critical temperatures (Tc's): a higher $T_c$ "2223" phase, Tc=110K; a lower $T_c$ "2212" phase, $T_c$ =80K; and a very low $T_c$ "2201" phase, $T_c$ =20K. As used herein, the term "2223 phase" denotes a phase having the nominal formula or $(Bi_2Sr_2Ca_2Cu_3O_x$ $(Bi,Pb)_2Sr_2Ca_2Cu_3O_x$; the term "2212 phase", a phase having the nominal formula $Bi_2Sr_2Ca_1Cu_2O_x$; the term "2201 phase", a phase having the nominal formula $Bi_2Sr_2Cu_1O_x$.

The crystal structures of the phases are characterized by c-axis lattice constants of about 36.8 Å, about 30.6 Å, and about 24.2 Å respectively. Since the phases differ from one another in the number of Cu-O and Ca layers per unit cell, syntactic intergrowths can occur through faults in the stacking sequences. These intergrowths interfere with efforts to obtain pure superconducting single crystals. Efforts aimed at direct crystal growth of pure 2223 phase from the melt or flux have been unsuccessful.

Formation of the higher $T_c$ 2223 phase, in a volume fraction sufficient to materially affect the bulk $T_c$, has been achieved in these materials only by conversion of the lower $T_c$ 2212 phase to the 2223 phase by heating samples at high temperatures near the melting temperature for long periods of time, measured in days or weeks. A variety of ceramic processing methods have been used to increase the fraction of the higher $T_c$ phase. These include (a) addition of lead; (b) use of copper- and calcium-rich starting compositions; and (c) prolonged heat treatment close to the melting point. The substitution of lead for bismuth in the bismuth oxide planes of the crystal structure of the 2223 phase has been used to strengthen Bi-O bondings and to facilitate the formation of a relatively pure 2223 phase. Furthermore, the addition of lead oxides into the matrix also can lower the melting point and viscosity of the glassy (amorphous) phase, probably by acting as a fluxing agent. All of these effects suggest that the formation of 2223 phase is a thermodynamically difficult and kinetically sluggish process.

Even when using methods a, b, and c, a long annealing time is usually still required to promote formation of the high $T_c$ phase. For example, method (a) can involve annealing at 845° C. for 200-300 hr to form samples containing 90% of 2223 phase; method (b) can involve a rapidly solidified melting process followed by an annealing at 865° C. for 11 days to produce a mixture of 2212 and 2223 phases; and method (c) can involve annealing at high temperatures for 18-26 days to produce 50-90% of 2223 phase. Such long annealing times severely affect the fabrication of the Bi-Sr-Ca-Cu-O superconductors into appropriate shapes, such as wires and tapes, for practical applications.

SUMMARY OF THE INVENTION

The invention is a process for producing a high critical temperature bismuth strontium calcium copper oxide superconducting material. An intimate mixture is formed of a first superconducting material and a preselected amount of a second superconducting material. The first superconducting material is bismuth strontium calcium copper oxide or (bismuth lead) strontium calcium copper oxide, and has a bulk critical temperature below about 90K. The second superconducting material is bismuth strontium calcium copper oxide or (bismuth lead) strontium calcium copper oxide, and includes at least 20 v/o (volume percent) 2223 phase. The amount of second superconducting material added to the mixture is selected to result in an amount of 2223 phase in the mixture of about 2-50 w/o (weight percent) The mixture is annealed in an oxidizing atmosphere at a temperature of at least about 845° C. and below the melting temperature of the 2223 phase, for a time sufficient to increase the amount of 2223 phase in the mixture. In an alternate embodiment of the invention, one or both of the superconducting materials in the mixture are provided by drying, calcining, and annealing a precursor mixture of a $Sr(NO_3)_2$, solution, a $Ca(NO_3)_2$ solution, a $Cu(NO_3)_2$, solution, a $Bi_2O_3$ powder, and a PbO powder.

BRIEF DESCRIPTION OF THE DRAWINGS

For a better understanding of the present invention, together with other objects, advantages and capabilities thereof, reference is made to the following Description and appended claims, together with the Drawings, in which:

FIG. 2 is an X-ray diffractogram of a seeded sample of FIG. 1 annealed for 192 hr, indicating a single 2223 phase;

FIG. 3 is an X-ray diffractogram of a control sample of FIG. 1, indicating nearly equal fractions of 2212 phase and 2223 phase;

DETAILED DESCRIPTION OF THE PREFERRED EMBODIMENTS

Figure 1:
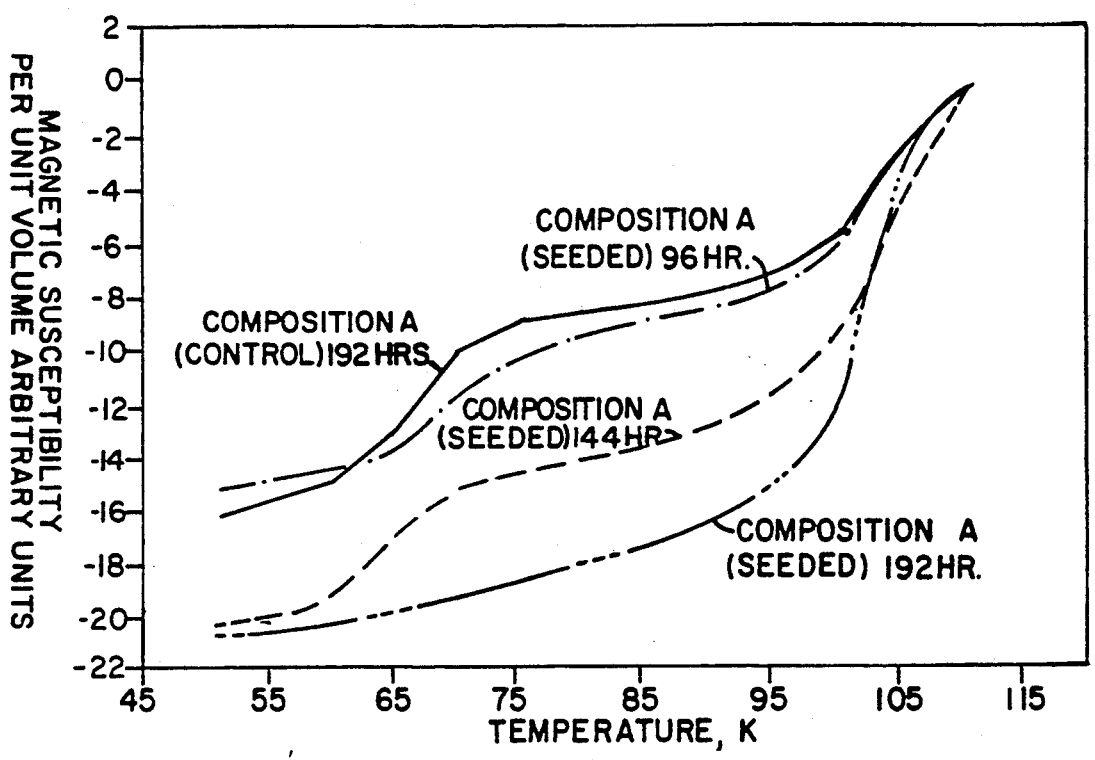
FIG. 1 is a graphical representation showing the effect of sintering time on the evolution of 2223 phase material for superconducting materials seeded with 2 w/o 2223 phase material and annealed in accordance with one embodiment of the invention, but for different annealing times, and for an unseeded control material.

The processing methods described herein accelerate the formation of the higher $T_c$ 2223 phase by seeding the Bi-Sr-Ca-Cu-O superconducting powders containing mostly low $T_c$ 2212 phase with high $T_c$ 2223 phase. This acceleration makes it possible to obtain a high fraction of 2223 phase in a reasonable annealing time, but only when the above-described requirements of starting powder composition and annealing conditions are met. The acceleration is accomplished by one of two variations of the method. In the first variation a crystalline, lower $T_c$ 2212 phase Bi-Sr-Ca-Cu-O or (Bi, Pb)-Sr-Ca-Cu-O powder is seeded with 2223 phase as nucleation sites by adding a small amount of crystalline powder containing a high fraction of 2223 phase to promote an increase in the 2223 phase. In the second variation an essentially completely low $T_c$ 2212 phase, amorphous Bi-Sr-Ca-Cu-O or Bi-Pb-Sr-Ca-Cu-O system is seeded with a small amount of the crystalline high 2223 phase powder to promote crystallization and formation of 2223 phase.

As described in the background section, a long annealing time is normally required for the system of Bi-Sr-Ca-Cu-O to form high Tc-phase. The effect of the substitution of PbO into bismuth oxide planes of the crystal structure of the 2223 phase has been recommended to strengthen Bi-O bondings and to facilitate the formation of a relatively pure 2223 phase. Furthermore, addition of PbO into the matrix also lowers the melting point and viscosity of the glassy (amorphous) phase, probably by acting as a fluxing agent.

All of this suggests that the formation of 2223 phase is a thermodynamically difficult and kinetically sluggish process. As described herein, introducing crystalline seeds into the lower $T_c$ crystalline or amorphous materials, promoting formation of the 2223 phase, shortens the annealing time required to convert the lower $T_c$ material to the higher $T_c$ 2223 phase. Introduction of these crystalline seeds into the amorphous materials initiates and promotes the crystallization of the desirable 2223 phase or a metastable phase. The processes described herein therefore promote the formation of the desirable 2223 phase or a metastable phase. The processes described herein therefore promote the formation of high $T_c$ crystalline phase and shorten the annealing time required to make these superconducting materials suitable for practical applications.

Methods are known in the art for preparing largely lower $T_c$ 2212 Bi-Sr-Ca-Cu-O or (Bi,Pb)-Sr-Ca-Cu-O material used herein as a precursor material for seeding to produce 2223 phase. For example, precursor powders for (Bi,Pb)-Sr-Ca-Cu-O based material may be intimately mixed in a molar ratio between (1.6.0.4)-2.-0–2.0–3.0 (stoichiometric for the 2223 phase) and (1.6,0.4)-2.0–2.0–4.0 (copper-rich) by nitrate-precursor routes or by metal-alkoxide routes, then sintered to produce a superconducting material. See, for example, H. K. Liu et. al., *Physica C.* 157, 93 (1989); D. L. Segal, *J. Non-Cryst. Solids* 63, 183 (1984); or P. Barbaux et. al., *J. Appl. Phys.* 63, 2725 (1988); all incorporated herein by reference. Both nitrate-precursor routes and metal-alkoxide routes promote homogeneous mixing of the components of the superconducting product. Compositional homogeneity at the molecular level and fine particle size of the components can be of great assistance in promoting the formation of the kinetically sluggish 2223 phase.

In a preferred, novel synthesis using nitrate precursors, Bi-Pb-Ca-Cu-O powders may be prepared by mixing (by a solution method) stoichiometric amounts of mixed nitrates of bismuth, strontium, and calcium, dissolved in suitable solvents, e.g. those disclosed in Liu et al., referenced above; drying and milling the mixed nitrates and oxides; and decomposing the nitrates in the mixture to form the corresponding oxides. The resulting brownish oxide mixture is milled, then calcined to yield black Bi-based powders of fine particle size and micaceous morphology. The elemental analysis of the resulting powder may be performed by Inductive Coupling Plasma (ICP) to ensure compositional homogeneity. The thus-prepared powders may be characterized by measuring the a.c. magnetic susceptibility and by x-ray diffraction, and will have a $T_c$ of about 80K, indicating that the powder is nearly completely the lower $T_c$ 2212 phase. A trace amount of the 110K 2223 phase is normally also detected by a.c. magnetic susceptibility measurement.

To prepare a suitable, higher 2223 phase content seeding material, a largely 2212 phase, lower $T_c$ powder, prepared as described above or by other methods, is conveniently first pressed into pellets, e.g. with a diameter of about 1.25 cm. The pellets are then annealed in an oxidizing atmosphere, at a temperature, and for a time, e.g. in air at about 850° C. for about 96 hr, to convert a significant amount of the lower $T_c$ 2212 phase to the higher $T_c$ 2223 phase. Alternatively, the largely 2212 phase material may be annealed as a powder. The treated pellets are cooled to ambient and crushed. The crushed pellets (or annealed powder) are then milled and screened to produce a fine powder, e.g 10–50 μm diameter. A typical powder prepared in this way contains about 20–50 v/o 2223 phase, preferably at least 30 v/o. Alternatively, a longer annealing time may be used to effect a higher volume percent 2223 phase, even up to 100 percent.

A lower $T_c$ 2212 phase crystalline powder, prepared either as described above or by other methods, may then be seeded with a small fraction of the above-prepared powder containing a high fraction of 2223 phase to serve as nucleation sites. The prepared seeding material is typically analyzed, e.g. by X-ray diffraction and/or ac magnetic susceptibility with a SQUID magnetometer, to determine the amount of 2223 phase present. The amount of the improved $T_c$ powder used for seeding then may be selected to result in seeding with at least about 2 w/o 2223 phase, to effectively promote the formation of 2223 phase and shorten annealing time. Theoretically, any amount of less than 100 percent 2223 phase may be added as seeding material to increase 2223 content; however, a much smaller fraction, 50 w/o or less, normally is added for practical and economic reasons. Preferably the amount of 2223 phase is no higher than about 20 w/o, most preferably about 10 w/o.

The seeding material (with a high fraction of 2223 phase) is thoroughly mixed into the base material (largely 2212 phase), e.g. by a Spex mixer (Spex Industries, Inc., Scotch Plains, New Jersey, U.S.A). Homogeneous mixing can be an important factor in optimizing the catalytic effect of the seeded grains of 2223 phase on the desired promotion of 2223 formation in the base material. The seeded mixture may then be pressed into pellets containing, e.g., 2–10 w/o high Tc-2223 phase, and annealed, preferably at 845°–865° C., in an oxidizing atmosphere, e.g. air or oxygen, for a time sufficient to achieve the desired increase in high Tc-2223 phase in the superconducting material. The percentage of the high Tc-2223 phase formed in the materials may be determined by measuring the SQUID data (ac magnetic susceptibility) of the seeded and annealed materials. The seeded and annealed materials may also be characterized by X-ray diffractogram to detect the presence of single 2223 phase (c-axis lattice constant=36.7 Å).

An alternative to the above-described methods involving seeding crystalline, largely 2212 phase powders is to incorporate a crystalline, high 2223 phase material into an amorphous, largely 2212 phase powder (prepared by rapid solidification from the melt) to promote the crystallization of 2223 phase. Prior to the present invention it was thought to be advantageous to first prepare Bi-Sr-Ca-Cu-O and Bi-Pb-Sr-Ca-Cu-O based materials as amorphous phases when an increase in the amount of high $T_c$ 2223 phase was desired. Materials with the nominal compositions $Bi_{1.6}Pb_{0.4}Sr_{2.0}Ca_{2.0}Cu_{3.0}O_x$, $Bi_{1.4}Pb_{0.6}Sr_{2.0}Ca_{2.0}Cu_{3.0}O_x$, and $Bi_{2.0}Sr_{2.0}Ca_{4.0}Cu_{5.0}O_x$ prepared from mixed nitrates exhibit a tendency toward decomposition of the 2223 phase at temperatures above about 870° C. Preparation of the superconducting materials via the amorphous phase preserved some of the 2223 phase from decomposition at high temperature. Although the 2223 phase may be developed without decomposition by the method described herein, seeding can also be of benefit in amorphous phase samples, improving 2223 phase development and crystallization over that achieved in amorphous unseeded samples.

In such an alternate process, the amorphous phase of Bi-Sr-Ca-Cu-O and Bi-Pb-Sr-Ca-Cu-O based materials may be seeded to promote crystallization and development of the 2223 phase. A lower $T_c$ powder, synthesized as described above or by other methods, may be melted, e.g. by heating at about 1000°–1200° C. for 6 min, then quenched to ambient. Samples so prepared are in an amorphous state, and may be characterized by an X-ray diffraction method. A portion of powder containing a high fraction of crystalline 2223 phase may be thoroughly mixed into premilled amorphous powder followed by cold pressing into pellets, as described above for the crystalline samples. As also described above for the crystalline samples, the amount of the improved $T_c$ powder used for seeding is selected to result in seeding with at least about 2 w/o 2223 phase, to effectively promote the formation of 2223 phase and shorten annealing time. Any amount of less than 100 percent 2223 phase may be used; however, preferably the amount of 2223 phase is no higher than about 50 w/o, preferably about 20 w/o, most preferably about 10 w/o, for practical and economic reasons. The pellets containing, e.g., 2–10 w/o high $T_c$ 2223 phase, are then annealed, e.g. at 850°–865° C. in air or oxygen for a time sufficient to achieve the desired improvement in the amount of high Tc 2223 phase in the superconducting material. Annealing of these amorphous pellets can double the amount of the high Tc 110K phase as compared to similar pellets without seeding under the same annealing conditions.

The following Examples are presented to enable those skilled in the art to more clearly understand and practice the present invention. These Examples should not be considered as a limitation upon the scope of the present invention, but merely as being illustrative and representative thereof.

EXAMPLES

Crystalline (Bi,Pb)-Sr-Ca-Cu-O samples were seeded as described below to promote formation of the 2223 phase.

Preparation of Initially Sintered Powders:

Powders of four nominal compositions were each prepared in known manner by thermal decomposition of suitable mixed nitrates in the stoichiometric proportions of Bi:Pb:Sr:Ca:Cu shown in Table I. Compositions B, C, and D were calcium-and/or copper-rich. For each composition, stoichiometric amounts for the composition of the nitrates $Sr(NO_3)_2$, $Ca(NO_3)_2$, and $Cu(NO_3)_2$ (as solutions) and $Bi_2O_3$ and PbO (as powders) were thoroughly mixed, dried, milled and calcined at 700° C. in air to decompose the nitrates to form their corresponding oxides. The brownish mixed oxides were milled for 24 hours to ensure homogeneity, then calcined at 840° C. in air for 10 hours to yield black Bi-based powders with a micaceous morphology (platelet flakes). The elemental analysis of each resulting powder, also shown in Table I, was performed by Inductively Coupled Plasma (ICP). The resulting products, used as precursor powders, were characterized by x-ray diffraction, and exhibited a nearly single phase 2212 material, as shown in Table I.

TABLE I

| Compn. | Starting Composition Bi:Pb:Sr:Ca:Cu | Elemental Analysis Bi:Pb:Sr:Ca:Cu | XRD Phase ID |
|---|---|---|---|
| A | 0.8:0.2:1.0:1.0:1.5 | 0.8:0.2:1.0:1.0:1.47 | 2212 phase |
| B | 0.8:0.2:0.8:1.2:1.8 | 0.8:0.2:0.8:1.2:1.7 | 2212 phase, detectable $Ca_2PbO_4$ |
| C | 0.8:0.2:0.8:1.2:2.0 | 0.81:0.2:0.8:1.2:1.94 | 2212 phase, detectable $Ca_2PbO_4$, $CuO$ |
| D | 0.8:0.2:1.0:1.0:2.0 | 0.78:0.2:1.0:1.0:1.96 | 2212 phase, detectable CuO |

EXAMPLE 1

Preparation of a First Seeding Material

A quantity of seeding material was then prepared from a portion of the Composition A powder prepared above. A first sample of Composition A powder was uniaxially cold pressed at psi into pellets 1.25 cm in diameter and 0.25 cm thick, each pellet weighing about 300–500 mg. The pellets were sintered in air at 850° C. for 96 hours to produce the high $T_c$ phase in a fraction of about 40 v/o, as determined from the intensity ratio at 4.8° and 5.8° of the X-ray diffraction pattern and the ac magnetic susceptibility measurement. The X-ray diffraction 002 reflections at 4.8° and 5.8° are the characteristic peaks for 2223 phase and 2212 phase respectively. The pellets were then ground into fine particles to be used as a first seeding material.

Preparation of a Composition A Powder of Enhanced 2223 Phase

The first seeding material was then used to enhance formation of the 2223 phase in additional samples of the above-described initially sintered Composition A material. A 0.13 gm sample of the first seeding material was mixed into a 2.5 gm sample of the initially sintered Composition A powder. The amount of seeding powder added was calculated to result in 2 w/o added 2223 phase. The sample was thoroughly mixed using a Spex mixer, and uniaxially cold pressed at 4000 psi into 1.25 cm diameter by 0.25 cm thick pellets, each pellet weighing about 300–500 mg. These pellets were then placed on a platinum wire rack in an alumina boat and annealed in a furnace in air, using a 1.5°–2° C./min heating rate to reach 850°–852° C. and holding at that temperature for various lengths of time, as shown in Table II. The pellets were then cooled to ambient at 2° C./min. An unseeded sample was used as a control. The volume fractions of 2223 phase in the samples were determined by X-ray diffraction and ac magnetic susceptibility measurement; the average fractions are shown in Table II. The effect of sintering time on the evolution of 2223 phase material is illustrated in FIG. 1, showing the average a.c. magnetic susceptibilities (SQUID) data of the 2 w/o seeded samples annealed for different times. Also shown in FIG. 1 for comparison are the SQUID data for the unsintered control sample sintered under the same conditions for 192 hr. It is evident that the formation of the 2223 phase is a kinetically slow process at this annealing temperature. However, a single 2223 phase can be formed at this temperature by prolonged annealing of a seeded sample.

EXAMPLE 2

Preparation of Composition A Powder Varying Seeding Amounts

The first seeding material was used in various fractions to enhance formation of the 2223 phase in additional samples of the above-described initially sintered material of Composition A. The samples were prepared as described for Example 1, except that the fraction of first seeding material was selected to produce mixtures containing 2 w/o, 5 w/o, and 10 w/o 2223 phase. The samples were annealed in air at 850° C. for various times, as shown in Table II. No further improvement in 2223 fraction resulted by increasing the fraction from 2 w/o to 5 w/o 2223 phase at this temperature. An increase to 10 w/o 2223 phase, however, did result in an improvement. These improved results are highly reproducible.

EXAMPLES 3–7

Preparation of a Second Seeding Material

The seeded sample from Example 1 annealed for 192 hours contained a single phase of 2223 material, defined as no detectable X-ray diffraction reflection at $2\theta = 5.8°$ and no 2212 phase fraction detectable by ac magnetic susceptibility measurement. The X-ray diffractogram of one of the 2 w/o seeded samples of Example 1 annealed for 192 hr is illustrated in FIG. 2, indicating a single 2223 phase at $2\theta = 4.8°$ and no detectable 2212 phase at $2\theta = 5.8°$. This may be compared with FIG. 3, in which the comparison of the peaks at $2\theta = 4.8°$ and $2\theta = 5.8°$ of one control sample indicates nearly equal fractions of 2212 phase and 2223 phase. $T_c$ (at dc resistance=0) of the 2 w/o seeded samples annealed for 192 hours were 110K as measured by ac magnetic susceptibility. This 192 hour anneal seeded material was crushed into fine powder to provide a second seeding material of 100% 2223 phase.

Preparation of Additional Powders of Enhanced 2223 Phase

The second seeding material was then used to enhance formation of the 2223 phase in further samples of the above-described initially sintered materials of starting compositions A, B, C, and D. The following parameters were varied for the various starting compositions to determine their effects on enhancement of the 2223 phase annealing time, annealing temperature, and starting composition. For most starting compositions an unseeded sample was used as a control.

For each starting composition, a portion of the second seeding material was mixed into a sample of the initially sintered powder. The amount of seeding powder added was calculated to result in 10 w/o added 2223 phase. Each sample was thoroughly mixed using a Spex mixer, and uniaxially cold pressed at 4000 psi into a 1.25 cm diameter by 0.25 cm thick pellet weighing about 300–500 mg. For most of the samples, a similarly prepared but unseeded sample was provided as a control. The samples were then placed on a platinum wire rack in an alumina boat and annealed in air. For Examples 3–6, each unseeded control pellet was placed with a seeded pellet in vertically adjacent positions on the wire rack for annealing together. A 2° C./min heating rate was used to reach the annealing temperature, and holding at that temperature for various lengths of time, as shown in Table II. The pellets were then cooled to ambient at 1.5° C./min. The temperature was carefully monitored throughout the heating cycle using a thermocouple placed directly above the pellets. The fractions of 2223 phase produced in the samples, as determined by X-ray diffraction and ac magnetic susceptibility measurements, are listed below in Table II.

TABLE II

| Ex. | Starting Compn. | Seed 2223 Phase, w/o | Annealing Temp., °C. | Annealing Time, hr | Prod. 2223 Phase, v/o* |
|---|---|---|---|---|---|
| 1 | A | 2 | 850–852 | 96 | 50 |
|   |   |   |   | 144 | 80 |
|   |   |   |   | 192 | 100 |
|   | Control | 0 | 850–852 | 72 | 40 |
|   |   |   |   | 146 | 55 |
|   |   |   |   | 192 | 60 |
| 2 | A | 2 | 850–852 | 96 | 65 |
|   |   |   |   | 144 | 74 |
|   |   |   |   | 192 | 100 |
|   |   | 5 | 850–852 | 96 | 65 |
|   |   |   |   | 144 | 74 |
|   |   |   |   | 192 | 100 |
|   |   | 10 | 850–852 | 96 | 70 |
|   |   |   |   | 144 | 80 |
|   |   |   |   | 192 | 100 |
| 3 | A | 10 | 863–865 | 24 | 50 |
|   |   |   |   | 48 | 72 |
|   |   |   |   | 72 | 100 |
|   | Control | 0 | 863–865 | 24 | 28 |
|   |   |   |   | 48 | 42 |
| 4 | B | 10 | 850–852 | 24 | 60 |
|   |   |   |   | 48 | 80 |
|   | Control | 0 | 850–852 | 24 | 50 |
|   |   |   |   | 48 | 66 |
| 5 | B | 10 | 863–865 | 18 | 100 |
|   | Control | 0 | 863–865 | 18 | 90 |
| 6 | C | 10 | 850–852 | 24 | 55 |
|   |   |   |   | 863–865 | 18 | 100 |
|   | Control | 0 | 863–865 | 18 | 90 |
| 7 | D | 10 | 863–865 | 36 | 70 |

*Volume percents listed are approximate averages of more than one sample.

As may be seen in Table II, for Composition A, an average 8% increase in 2223 phase fraction was seen between the 2 w/o and the 10 w/o seeded samples after annealing at about 850° C. for 96 and 144 hours (Example 2). An increase in the annealing temperature from 850° to 865° C. at 10 w/o seeding fraction (Examples 2 and 3) resulted in even further improved 2223 content. The 2223 phase in the 10 w/o seeded sample was 50 v/o after only 24 hours annealing at 865° C., over 70 v/o after 48 hours, and a single 2223 phase was achieved after only 72 hours (Example 3). In the control samples for Composition A, only 60 v/o 2223 was developed after 192 hours at 850° C., less than 30 v/o after 24 hours at 865° C., and only 42 v/o after 48 hours at 865° C. (Examples 1 and 3).

These results indicate improvement in the 2223 phase fraction in Composition A when the temperature is increased from 850° C. to 865 ° C. However, when a sample of Composition A was seeded at 10 w/o and annealed at 870°–875° C., i.e. at the melting temperature of the 2223 phase, only trace amounts of 2223 phase were evident, indicating decomposition of the 2223 phase. When a similar sample was annealed at 845°–847° C., the 2223 phase fraction reached a maximum of 60 v/o after a 96 hour anneal. The 2223 fraction could not be increased further by longer annealing up to 192 hours, even by further increasing the seeding fraction, indicating the existence of a minimum temperature in achieving an optimal 2223 fraction or a single 2223 phase material.

Figure 4:
FIG. 4 is a photomicrograph showing the crystal structure of a sample seeded with 10 w/o 2223 phase and annealed at 850° C. in accordance with another embodiment of the invention.
Figure 5:
FIG. 5 is a photomicrograph showing the crystal structure of a sample seeded with 10 w/o 2223 phase and annealed at 865° C. in accordance with yet another embodiment of the invention.

The 865° C. temperature also improves the development of elongated grains in the microstructure, thus improving the critical current density of the material. The crystal morphologies of samples of Composition A seeded at 10 w/o and annealed at 850° C. and at 865° C. are shown in FIGS. 4 and 5, respectively. Although both materials depicted were single 2223 phase, FIG. 5 shows grain growth in the microstructure after 48 hr at 865° C., while in FIG. 4 no grain growth is evident even after 192 hr at 850° C.

The Table II data for Compositions B and C (Examples 4–6) indicate that temperatures near but below the 2223 phase melting temperature are preferred for maximizing the 2223 phase in the seeded samples of various starting compositions. Good results are also achieved for Composition D at 865° C. (Example 7). The data for Compositions B and C, the calcium-rich and calcium-and-copper-rich compositions respectively (Examples 4–6), indicate that a single 2223 phase can be achieved in only 18 hours annealing at 865° C. Compositions B and C exhibit faster reaction kinetics than Compositions A and D. This indicates that such enrichment can speed up the reaction kinetics when the correct temperature and seeding fraction are provided. The reaction rate for formation of 2223 phase, however, appears to be about the same for stoichiometric Composition A and for copper-rich Composition D. Also, the presence of excess calcium and or copper slightly depresses the $T_c$, i.e. to about 105K.

All of these results demonstrate the improvement in higher $T_c$ 2223 phase content achieved by the method described herein.

EXAMPLE 8

Preparation of Lead-Containing Seeded and Control Samples

To show the effect of seeding on 2223 phase development in the presence of lead in the method described herein, samples of Composition B seeded at 10 w/o were prepared as described above for Examples 1–7 and were annealed in air at 865° C. for 24 and 36 hours, times prolonged beyond that required to develop a single 2223 phase in the 10 w/o seeded material. Unseeded control samples were also similarly prepared and annealed in air at 865° C. for 24 and 48 hours. These samples and the 18 hr anneal seeded sample from Example 5 were analyzed by Electron Probe Microanalysis to determine the amount of stabilizing lead incorporated into the crystal structure. All of the seeded samples were single 2223 phase.

Figure 6:
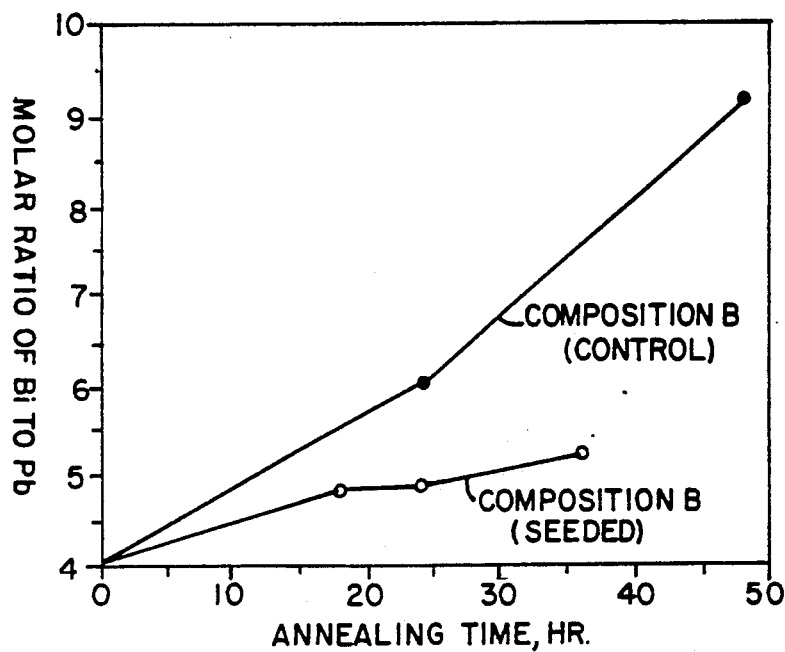
FIG. 6 is a graphical representation of the time dependence of the molar ratio of bismuth to lead for materials seeded with 10 w/o 2223 phase and annealed at 865° C. in accordance with still another embodiment of the invention, and for unseeded control materials.

The time dependence of the molar ratio of bismuth to lead in the samples of Example 4 are compared in FIG. 6. The lower curve of FIG. 6, representing the seeded samples, shows a stable Bi:Pb ratio beginning at about 18 hours, indicating rapid kinetics for the incorporation of stabilizing lead into the crystal structure which retards the decomposition of the 2223 phase. In contrast the upper curve of FIG. 6, representing the unseeded control samples, indicates a decrease in the amount of lead in the structure with prolonged annealing. This decrease interferes with the stabilization of the structure, and permits decomposition of the 2223 phase. FIG. 6 clearly illustrates that a single 2223 phase cannot be achieved in the unseeded sample, even in the presence of lead at this annealing temperature.

EXAMPLE 9

Preparation of Materials via the Amorphous Phase

The above Examples clearly demonstrate that the development of the 2223 phase without decomposition may be achieved in ways other than the amorphous phase route. However, seeding of amorphous phase samples can increase 2223 phase development and crystallization over those achieved in amorphous unseeded samples.

A powder composition was synthesized from mixed nitrates as described in Example 1. The precursor composition was of molar ratios of Bi:Pb:Sr:Ca:Cu of 0.8:0.2:1.0:1.0:2.0. Each sample was rapidly heated to 1200° C. in 1 hr, held for 6 minutes at this temperature, then quenched to ambient at a rate of about 10° C./min. The samples so prepared were characterized by X-ray diffraction and found to be in an amorphous state. An amount of high $T_c$ 110K phase of 2 w/o was then incorporated into the amorphous powder. An unseeded powder sample was similarly prepared. The powders were uniaxially cold pressed into pellets and annealed in air at 850° C. for 98 hr, in the same manner as described for Example 1. The annealed seeded samples were characterized by X-ray diffraction, and were shown to be crystalline mixtures of 2223 and 2212 phase. Further, the amount of the high $T_c$ 110K 2223 phase was much greater in the seeded sample as compared to the control sample under the same annealing conditions. The seeded sample achieved 8.0 v/o of 2223 phase as compared to 2.5 v/o for the unseeded sample.

The seeding process described above permits increasing the amount of higher $T_c$ 2223 phase in superconducting Bi-Sr-Ca-Cu-O or Bi-Pb-Sr-Ca-Cu-O samples while shortening the annealing time required to do so. This results in an improved superconducting material as well as increased efficiency in producing the material. The process is effective for the superconducting oxide in either crystalline or amorphous form.

While there has been shown and described what are at present considered the preferred embodiments of the invention, it will be obvious to those skilled in the art that various changes and modifications can be made therein without departing from the scope of the invention as defined by the appended claims.

We claim:

1. A process for producing a high critical temperature bismuth strontium calcium copper oxide superconducting material comprising the steps of:

forming an intimate mixture of a first superconducting material and a preselected amount of a second superconducting material; wherein:

said first superconducting material is selected from the group consisting of bismuth strontium calcium copper oxide and (bismuth lead) strontium calcium copper oxide, and has a bulk critical temperature below about 90K;

said second superconducting material is selected from the group consisting of bismuth strontium calcium copper oxide and (bismuth lead) strontium calcium copper oxide, and includes at least 20 volume percent 2223 phase; and said preselected amount of second superconducting material is selected to result in an amount of said 2223 phase in said mixture of about 2-50 weight percent; and annealing said mixture in an oxidizing atmosphere at a temperature of at least about 845° C. and below the melting temperature of said 2223 phase, for a time sufficient to increase said amount of 2223 phase in said mixture.

2. A process in accordance with claim 1 wherein said preselected amount of second superconducting material is selected to result in an amount of said 2223 phase in said mixture of about 2-20 weight percent.

3. A process in accordance with claim 2 wherein said preselected amount of second superconducting material is selected to result in an amount of said 2223 phase in said mixture of about 10 weight percent.

4. A process in accordance with claim 1 wherein said second superconducting material includes at least 30 volume percent 2223 phase.

5. A process in accordance with claim 1 wherein said annealing temperature is about 850°-865° C.

6. A process in accordance with claim 1 wherein said first superconducting material has a starting formulation having a bismuth:lead ratio of about 0.8:0.2 to about 0.7:0.3.

7. A process in accordance with claim 1 wherein said first superconducting material has the approximate nominal formula $(Bi_{0.8}Pb_{0.2})_{2.0}Sr_{2.0}Ca_{2.0}Cu_{3.0}O_x$, said annealing temperature is about 865° C., and said annealing time is at least about 72 hours.

8. A process in accordance with claim 1 wherein said first superconducting material has a starting formulation which is calcium-rich relative to a molar ratio of Bi:Sr:Ca:Cu of 2:2:2:3.

9. A process in accordance with claim 8 wherein said first superconducting material has a starting formulation which is calcium-rich and copper-rich relative to a molar ratio of Bi:Sr:Ca:Cu of 2:2:3:3.

10. A process in accordance with claim 9 wherein said first superconducting material has an approximate nominal formula selected from the group consisting of $(Bi_{0.8}Pb_{0.2})_{2.0}Sr_{1.6}Ca_{2.4}Cu_{3.6}O_x$ and $(Bi_{0.8}Pb_{0.2})_{2.0}Sr_{1.6}Ca_{2.4}Cu_{4.0}O_x$, said annealing temperature is about 865° C., and said annealing time is at least about 18 hours.

11. A process in accordance with claim 1 wherein said first superconducting material has the approximate nominal formula $(Bi_{0.8}Pb_{0.2})_{2.0}Sr_{2.0}Ca_{2.0}Cu_{4.0}O_x$, said annealing temperature is about 865° C., and said annealing time is at least about 36 hours.

12. A process in accordance with claim 1 wherein said annealing step is carried out for a time sufficient to produce a single 2223 phase in said mixture.

13. A process in accordance with claim 1 further including the step, before the mixture forming step, of providing said second superconducting material by annealing a portion of said first superconducting material in an oxidizing atmosphere at a temperature above about 850° C. and below the melting temperature of said 2223 phase for a time sufficient to develop at least 20 volume percent 2223 phase in said portion.

14. A process in accordance with claim 1 further including the step, before said annealing step, of pressing said mixture to form a pellet, and wherein said mixture is annealed in the form of said pellet.

15. A process for producing a high critical temperature bismuth strontium calcium copper oxide superconducting material comprising the steps of:

producing a first superconducting material selected from the group consisting of bismuth strontium calcium copper oxide and bismuth lead strontium calcium copper oxide by a process comprising the steps of:

mixing, in amount to produce a molar ratio of Bi:Sr:Ca:Cu or (Bi,Pb):Sr:Ca:Cu of about 2:2:2:3–2:2:2:.4:4, a $Sr(NO_3)_2$ solution, a $Ca(NO_3)_2$ solution, a $Cu(NO_3)_2$ a solution, a $Bi_2O_3$ powder, and a PbO powder to form a first mixture;

drying and milling said first mixture;

calcining said dried milled first mixture in an oxidizing atmosphere at a temperature and for a time sufficient to decompose said $Sr(NO_3)_2$, $Ca(NO_3)_2$, and $Cu(NO_3)_2$ to form their corresponding oxides, thus producing an oxide mixture;

milling said oxide mixture;

calcining said milled oxide mixture in an oxidizing atmosphere at a suitable temperature and for a time sufficient to produce said first superconducting material;

producing a second superconducting material including at least 20 volume percent 2223 phase by annealing at least a portion of said first superconducting material in an oxidizing atmosphere at a temperature above about 850° C. and below the melting temperature of said 2223 phase for a time sufficient to develop said at least 20 volume percent 2223 phase in said second superconducting material;

forming an intimate mixture of a third superconducting material and a preselected amount of said second superconducting material; wherein:

said third superconducting material is selected from the group consisting of bismuth strontium calcium copper oxide and bismuth lead strontium calcium copper oxide, and has a bulk critical temperature below about 90K; and said preselected amount of second superconducting material is selected to result in an amount of said 2223 phase in said mixture of about 20-50 weight percent; and annealing said mixture in an oxidizing atmosphere at a temperature of at least about 845° C. and below the melting temperature of said 2223 phase, for a time sufficient to increase said amount of 2223 phase in said mixture.

16. A process in accordance with claim 15 wherein a portion of said first superconducting material is annealed to produce said second superconducting material; and said third superconducting material is provided by another portion of said first superconducting material.

17. A process for producing a high critical temperature bismuth strontium calcium copper oxide superconducting material comprising:

forming an intimate mixture of a first superconducting material and a preselected amount of a second superconducting material; wherein said first superconducting material is selected from the group consisting of bismuth strontium calcium copper oxide and (bismuth lead) strontium calcium copper oxide, and has a bulk critical temperature below about 90K;

said second superconducting material is selected from the group consisting of bismuth strontium calcium copper oxide and (bismuth lead) strontium calcium copper oxide, and includes at least 20 volume percent 2223 phase; and said preselected amount of second superconducting material is selected to result in an amount of said 2223 phase in said mixture of about 10 weight percent; and annealing said mixture in an oxidizing atmosphere at about 865° C. for a time sufficient to increase said amount of 2223 phase in said mixture.

* * * * *